(12) United States Patent
Jacques et al.

(10) Patent No.: US 11,940,661 B2
(45) Date of Patent: Mar. 26, 2024

(54) SPLIT ENCLOSURE FOR FAN-LESS COOLING

(71) Applicant: Cisco Technology, Inc., San Jose, CA (US)

(72) Inventors: Joseph F. Jacques, Austin, TX (US); Edward John Kliewer, Sunnyvale, CA (US); Harrison S. Teplitz, Mountain View, CA (US)

(73) Assignee: Cisco Technology, Inc., San Jose, CA (US)

( * ) Notice: Subject to any disclaimer, the term of this patent is extended or adjusted under 35 U.S.C. 154(b) by 153 days.

(21) Appl. No.: 17/554,886

(22) Filed: Dec. 17, 2021

(65) Prior Publication Data

US 2023/0194810 A1  Jun. 22, 2023

(51) Int. Cl.
*H05K 7/20* (2006.01)
*G02B 6/42* (2006.01)
*H05K 9/00* (2006.01)

(52) U.S. Cl.
CPC ....... *G02B 6/4269* (2013.01); *H05K 7/20127* (2013.01); *H05K 7/20518* (2013.01); *H05K 9/0058* (2013.01); *H05K 9/0015* (2013.01)

(58) Field of Classification Search
CPC . H05K 7/20518; H05K 9/0009; H05K 9/0015
See application file for complete search history.

(56) References Cited

U.S. PATENT DOCUMENTS

| | | | | |
|---|---|---|---|---|
| 4,868,716 A | * | 9/1989 | Taylor | H05K 9/0062 361/818 |
| 4,872,090 A | * | 10/1989 | Taylor | H05K 9/0016 361/818 |
| 5,204,497 A | * | 4/1993 | Herrick | H05K 9/0041 361/679.02 |
| 7,254,034 B2 | * | 8/2007 | Bolle | H05K 7/20436 165/185 |

(Continued)

FOREIGN PATENT DOCUMENTS

| | | |
|---|---|---|
| CN | 112285848 A | 1/2021 |
| CN | 214012524 U | 8/2021 |

(Continued)

OTHER PUBLICATIONS

Notification of Transmittal of the International Search Report and The Written Opinion issued in corresponding International Application No. PCT/US2022/081355 dated Apr. 3, 2023 (25 pages).

*Primary Examiner* — Robert J Hoffberg
(74) *Attorney, Agent, or Firm* — Merchant & Gould P.C.

(57) ABSTRACT

A split enclosure apparatus for fan-less cooling may be provided. The apparatus may comprise a device and a housing. The device may comprise a plurality of components. The housing may enclose the device and may comprise a first external surface, a second external surface, and a joint between the first external surface and the second external surface. The first external surface may be dedicated to cooling a first one of the plurality of components. The second external surface may be dedicated to cooling a second one of the plurality of components. The joint (Continued)

between the first external surface and the second external surface may be electrically conductive and thermally resistive.

18 Claims, 6 Drawing Sheets

(56) References Cited

U.S. PATENT DOCUMENTS

| | | | |
|---|---|---|---|
| 8,552,725 B2* | 10/2013 | Abbink | G01C 19/60 |
| | | | 324/318 |
| 9,198,328 B1 | 11/2015 | Kokas et al. | |
| 9,596,761 B2 | 3/2017 | Bouda | |
| 11,129,302 B1* | 9/2021 | Sochoux | H01L 23/3672 |
| 2018/0067274 A1 | 3/2018 | Mack | |
| 2019/0182985 A1 | 6/2019 | Gaviola et al. | |
| 2019/0281691 A1 | 9/2019 | Matsui | |

FOREIGN PATENT DOCUMENTS

| | | |
|---|---|---|
| EP | 2861048 A1 | 4/2015 |
| JP | 2001168560 A | 6/2001 |
| KR | 20160135066 A | 11/2016 |

* cited by examiner

SPLIT ENCLOSURE FOR FAN-LESS COOLING

TECHNICAL FIELD

The present disclosure relates generally to an enclosure for fan-less cooling.

BACKGROUND

Most modern electronics equipment contains electronic components mounted on a circuit board. The circuit board may be enclosed in a housing with a front access door, side walls, and a backplane. The housing may prevent stray material from entering and damaging the electronic components. Additionally, the housing may prevent stray emission of electromagnetic energy.

The electronic components housed within the housing often generate heat during operation. If the temperature within the housing is allowed to raise unchecked, the electronic components may lose their effectiveness or become irreparably damaged. Thus, it is desirable to provide for the cooling of electronic components within the housing.

The electronic components may be cooled using a heat sink. The heatsink is a passive heat exchanger that transfers the heat generated by an electronic or a mechanical device to a fluid medium, often air or a liquid coolant, where it is dissipated away from the device, thereby allowing regulation of the device's temperature. In computers, heat sinks are used to cool Central Processing Units (CPUs) and some chipsets and Random Access Memory (RAM) modules. Heat sinks are used with high-power semiconductor devices such as power transistors and optoelectronics such as lasers and Light-Emitting Diodes (LEDs), where the heat dissipation ability of the component itself is insufficient to moderate its temperature.

A heat sink is designed to maximize its surface area in contact with the cooling medium surrounding it, such as the air. Air velocity, choice of material, protrusion design, and surface treatment are factors that affect the performance of a heat sink. Heat sink attachment methods and thermal interface materials also affect the die temperature of the integrated circuit. Thermal adhesive or thermal paste improve the heat sink's performance by filling air gaps between the heat sink and the heat spreader on the device. A heat sink is usually made out of aluminum or copper.

BRIEF DESCRIPTION OF THE FIGURES

The accompanying drawings, which are incorporated in and constitute a part of this disclosure, illustrate various embodiments of the present disclosure. In the drawings.

DETAILED DESCRIPTION

Overview

Figure 1:
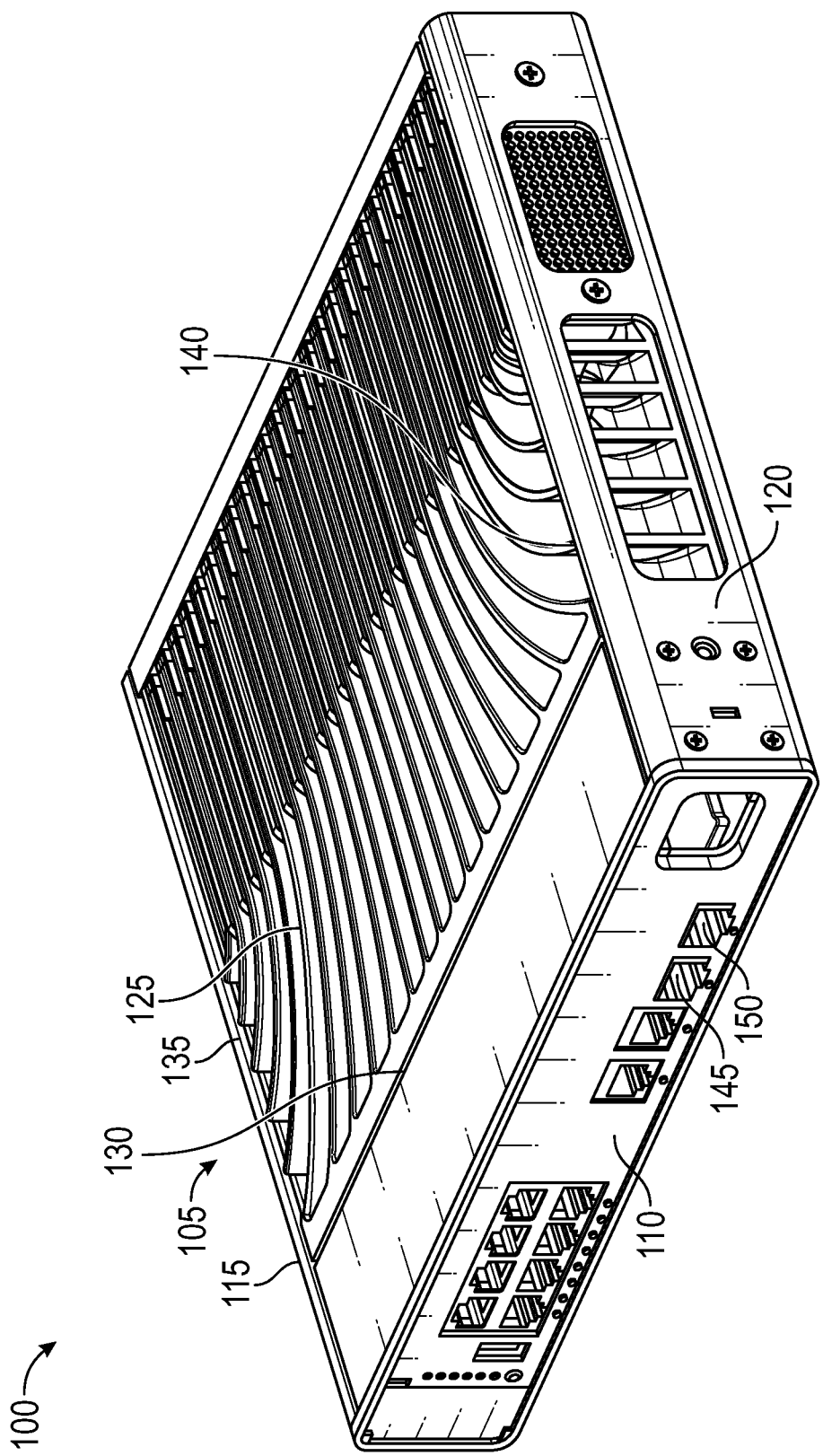
FIG. 1 shows an electronic system.

A split enclosure apparatus for fan-less cooling may be provided. The apparatus may comprise a device and a housing. The device may comprise a plurality of components. The housing may enclose the device and may comprise a first external surface, a second external surface, and a joint between the first external surface and the second external surface. The first external surface may be dedicated to cooling a first one of the plurality of components. The second external surface may be dedicated to cooling a second one of the plurality of components. The joint between the first external surface and the second external surface may be electrically conductive and thermally resistive.

Both the foregoing overview and the following example embodiments are examples and explanatory only and should not be considered to restrict the disclosure's scope, as described and claimed. Furthermore, features and/or variations may be provided in addition to those described. For example, embodiments of the disclosure may be directed to various feature combinations and sub-combinations described in the example embodiments.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

A housing (i.e., enclosure) may enclose a system circuit board. In some systems, the housing may be used to cool components on the system circuit board. Conducting heat dissipated from optical modules on the system circuit board to an outer skin of the housing for radiation and convection may be needed for adequate cooling in fan-less systems. The optical module cooling may be limited by increasing system circuit board power dissipation and/or reducing size of the enclosure, both of which may increase housing skin temperature thereby reducing the heat sink potential of the housing.

Embodiments of the disclosure may divide the housing into different external surfaces so that certain external surfaces of the housing may be dedicated to cooling the optical modules. These dedicated external surfaces may be interconnected to other housing external surfaces by joints (i.e., seams) having partially or fully plastic construction to minimize thermal conductivity. Joints between these external surfaces may be filled with fabric over foam gasketing for Electromagnetic Interference (EMI) grounding, and may use a thin steel perforated mating flange to minimize thermal conductivity to the hotter external surfaces of housing. The perforation holes in the flange may provide some ventilation in and out of the housing along the joints while still providing EMI grounding between the external surfaces. Selective application of low emissivity film or coatings on inside faces may provide further thermal isolation from hot system circuit board components to the dedicated cooling exterior surfaces. Accordingly, embodiments of the disclosure may physically split the outside of the housing into multiple parts that are combined in hot and cold regions that are insulated from each other. The cold regions of the housing surface may provide the necessary sink to cool, for example, temperature-sensitive optical modules in a fan-less system.

FIG. 1 shows a system 100 that may be fan-less. As shown in FIG. 1, system 100 may comprise a housing 105 that may contain a device. The device may comprise, but is not limited to, a network switch or router for example. Housing 105 may comprise a front panel 110, a first side 115, a second side 120, and a top 125. A first joint 130 may be disposed between front panel 110 and top 125. A second joint 135 may be disposed between first side 115 and top 125. A third joint 140 may be disposed between second side 120 and top 125.

Consistent with embodiments of the disclosure, front panel 110, first side 115, and second side 120 may comprise a first external surface dedicated to cooling a first one of a plurality of components comprising the device. Furthermore, top 125 may comprise a second external surface dedicated to cooling a second one of the plurality of components comprising the device. First joint 130, second joint 135, and third joint 140 may collectively comprise a joint between the first external surface and the second external surface that is electrically conductive and thermally resistive as described in greater detail below.

As stated above, the device may comprise a plurality of components. The first one of the plurality of components may comprise an optical module (e.g., a first optical module 145 or a second optical module 150). The optical module may comprise, but is not limited to, a Small Form-Factor Pluggable (SFP) module. The second one of the plurality of components may comprise, but is not limited to, an Application Specific Integrated Circuit (ASIC), a physical layer (PHY) component, or a memory. An ASIC may comprise an Integrated Circuit (IC) chip customized for a particular use rather than intended for general-purpose use. A PHY component may comprise an electronic circuit (e.g., implemented as an IC) used to implement physical layer functions of the Open Systems Interconnection OSI model in a network interface controller. A PHY component may connect a link layer device to a physical medium such as an optical fiber or copper cable and may include both Physical Coding Sublayer (PCS) and Physical Medium Dependent (PMD) layer functionality.

As stated above, embodiments of the disclosure may physically split housing 105 into multiple parts (i.e., the first external surface and the second external surface) that may be combined in hot and cold regions that may be insulated from each other. The cold regions (e.g., first external surface) of housing 105 may provide the necessary sink to cool, for example, temperature-sensitive optical modules in a fan-less system. Accordingly, the first external surface may be cooler than the second external surface. For example, the first external surface may cool the first one of the plurality of components to 70 degrees C. or less. The second external surface may cool the second one of the plurality of components to 95 degrees C. or less.

Figure 2:
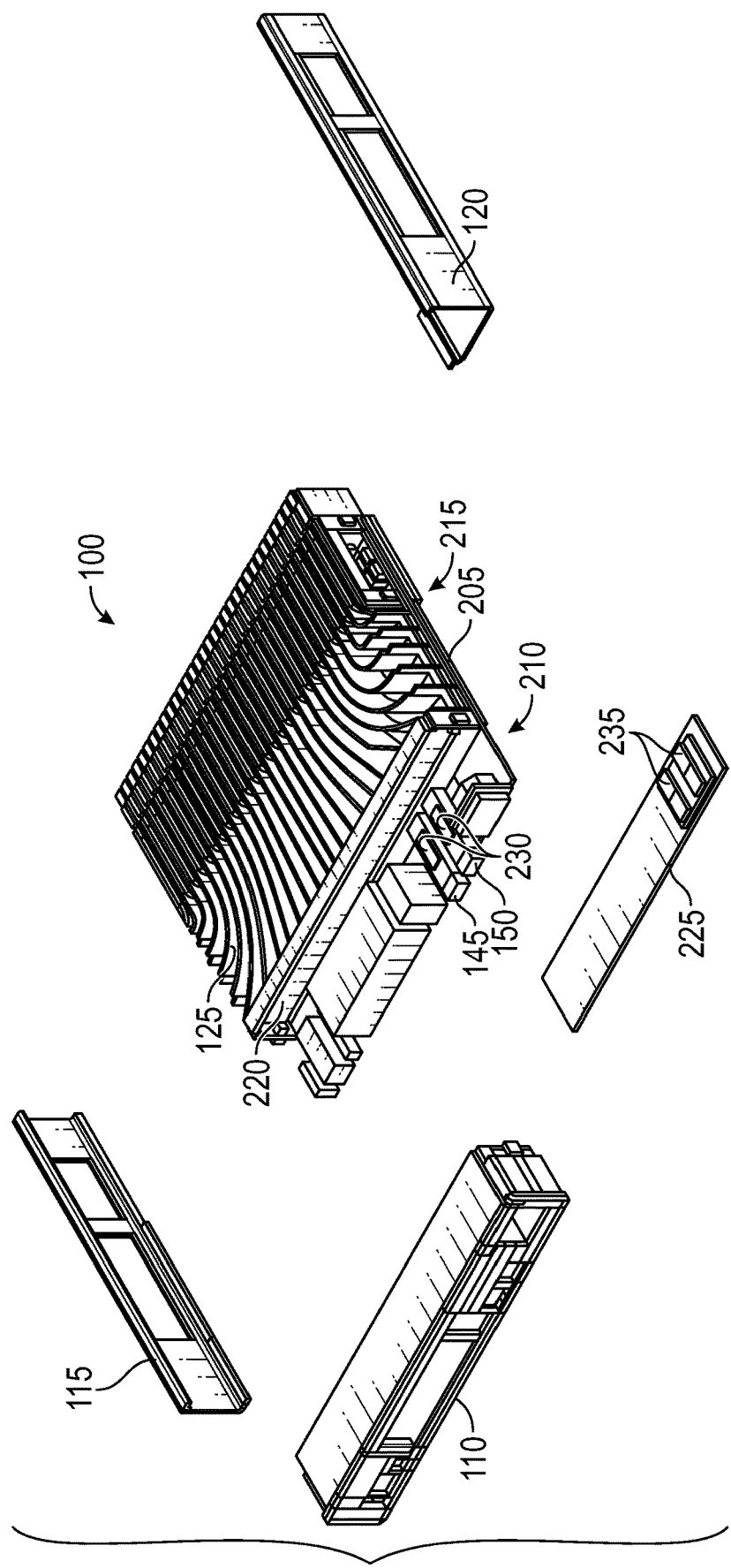
FIG. 2 shows an exploded view of the electronic system.

FIG. 2 shows an exploded view of system 100. As shown in FIG. 2, system 100 may comprise a device 205 that may be divided into two section. The two sections may comprise a first section 210 and a second section 215. Components (i.e., the first one of the plurality of components) in first section 210 may be cooled with the first external surface. Components (i.e., the second one of the plurality of components) in second section 215 may be cooled with the second external surface. First section 210 and second section 215 may be separated by a bulkhead 220 that may limit heat transfer between first section 210 and second section 215.

In addition, FIG. 2 shows that housing 105 may further comprise a bottom 225 at may be included in the first external surface for cooling the first one of the plurality of components (e.g., first optical module 145 or second optical module 150). Top side spreader plates 230 treated with Thermal Interface Material (TIM) may respectfully connect first optical module 145 and second optical module 150 to an interior of front panel 110 to allow heat transfer from first optical module 145 and second optical module 150 to front panel 110 that may be included in the first external surface. Bottom side spreader plates 235 treated with TIM may respectfully connect first optical module 145 and second optical module 150 to an interior of bottom 225 to allow heat transfer from first optical module 145 and second optical module 150 to bottom 225 that may be included in the first external surface.

Inward facing surfaces of first side 115, second side 120, bulkhead 220, and bottom 225 may be treated with a low emissivity coating. The low emissivity coating may comprise, but is not limited to, Alodine (i.e., clear chromate) plating or aluminized Mylar film for example, to increase thermally resistive by inhibiting infrared radiation.

Figure 3:
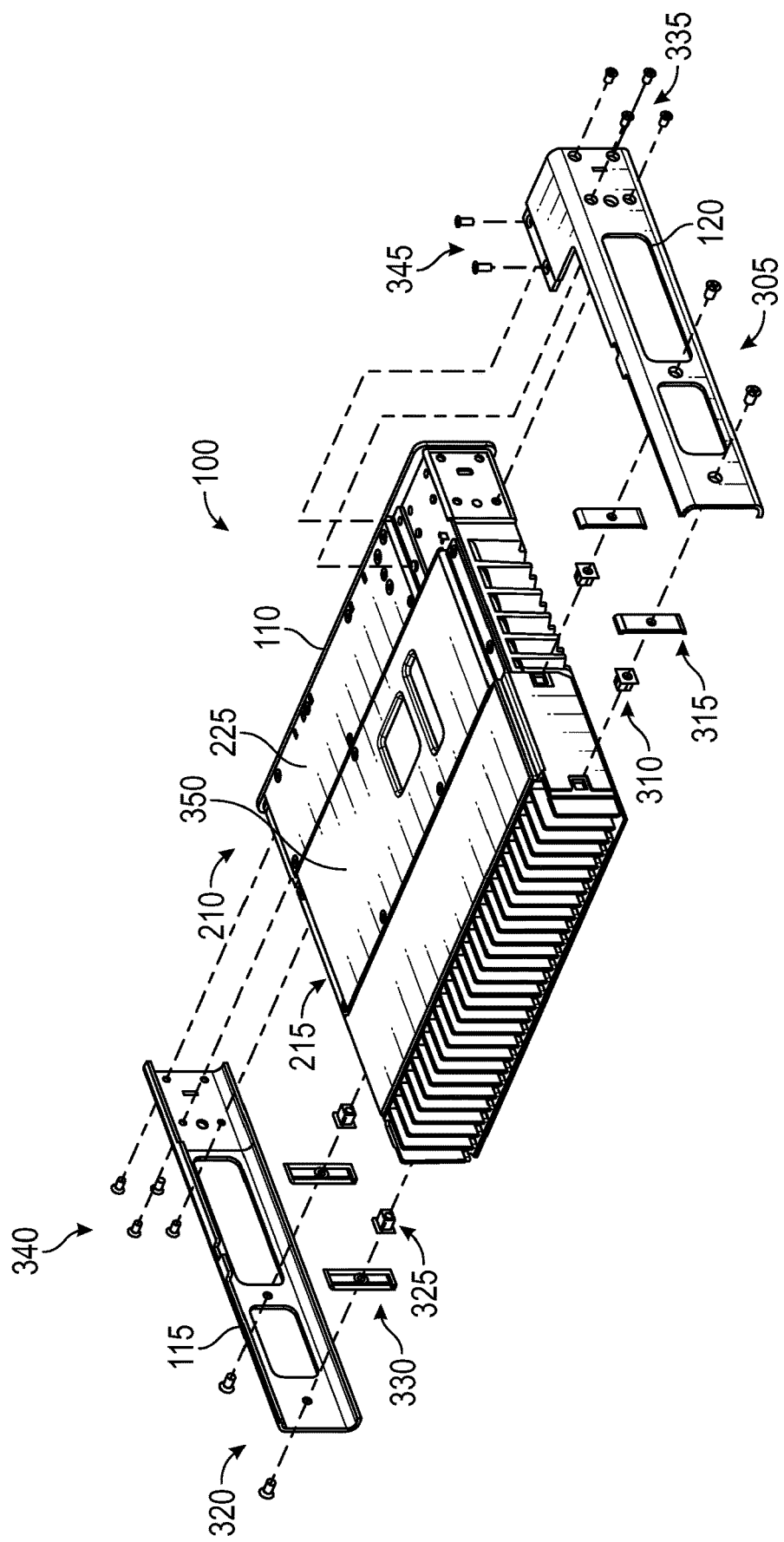
FIG. 3 shows a bottom view of the electronic system.

FIG. 3 shows a bottom view of system 100. As shown in FIG. 3, non-conductive fasteners and non-conductive spacers may be used to attach first side 115 and second side 120 to second section 215. For example, a first plurality of fasteners 305 and a first plurality of connectors 310 may be used to attach second side 120 to second section 215. Because first plurality of fasteners 305 and first plurality of connectors 310 may be non-conductive (e.g., plastic), they may resist transferring (e.g., conducting) heat from second section 215 to second side 120. A first plurality of spacers 315 may be disposed between second side 120 and second section 215 in order to maintain an air gap (e.g., minimum 2 mm air gap) allowing heat convection in the air gap. This air gap may provide further resistance to transferring heat from second section 215 to second side 120. First plurality of spacers 315 may also be non-conductive (e.g., plastic).

Furthermore, a second plurality of fasteners 320 and a second plurality of connectors 325 may be used to attach first side 115 to second section 215. Because second plurality of fasteners 320 and second plurality of connectors 325 may be non-conductive (e.g., plastic), they may resist transferring (e.g., conducting) heat from second section 215 to first side 115. A second plurality of spacers 330 may be disposed between first side 115 and second section 215 in order to maintain an air gap (e.g., minimum 2 mm air gap) allowing heat convection in the air gap. This air gap may provide further resistance to transferring heat from second section 215 to first side 115. Second plurality of spacers 330 may also be non-conductive (e.g., plastic).

As shown in FIG. 3, conductive fasteners may be used to attach first side 115 and second side 120 to front panel 110. For example, third plurality of fasteners 335 may be used to attach second side 120 to front panel 110. Fourth plurality of fasteners 340 may be used to attach first side 115 to front panel 110. Fifth plurality of fasteners 345 may be used to attach second side 120 to bottom 225. Because these fasteners may be conductive, heat may transfer to front panel 110 and bottom 225 from first side 115 and second side 120. FIG. 3 also shows an under panel 350 comprising a bottom of system 100 underneath second section 215 as will be discussed in greater detail below.

Figure 4:
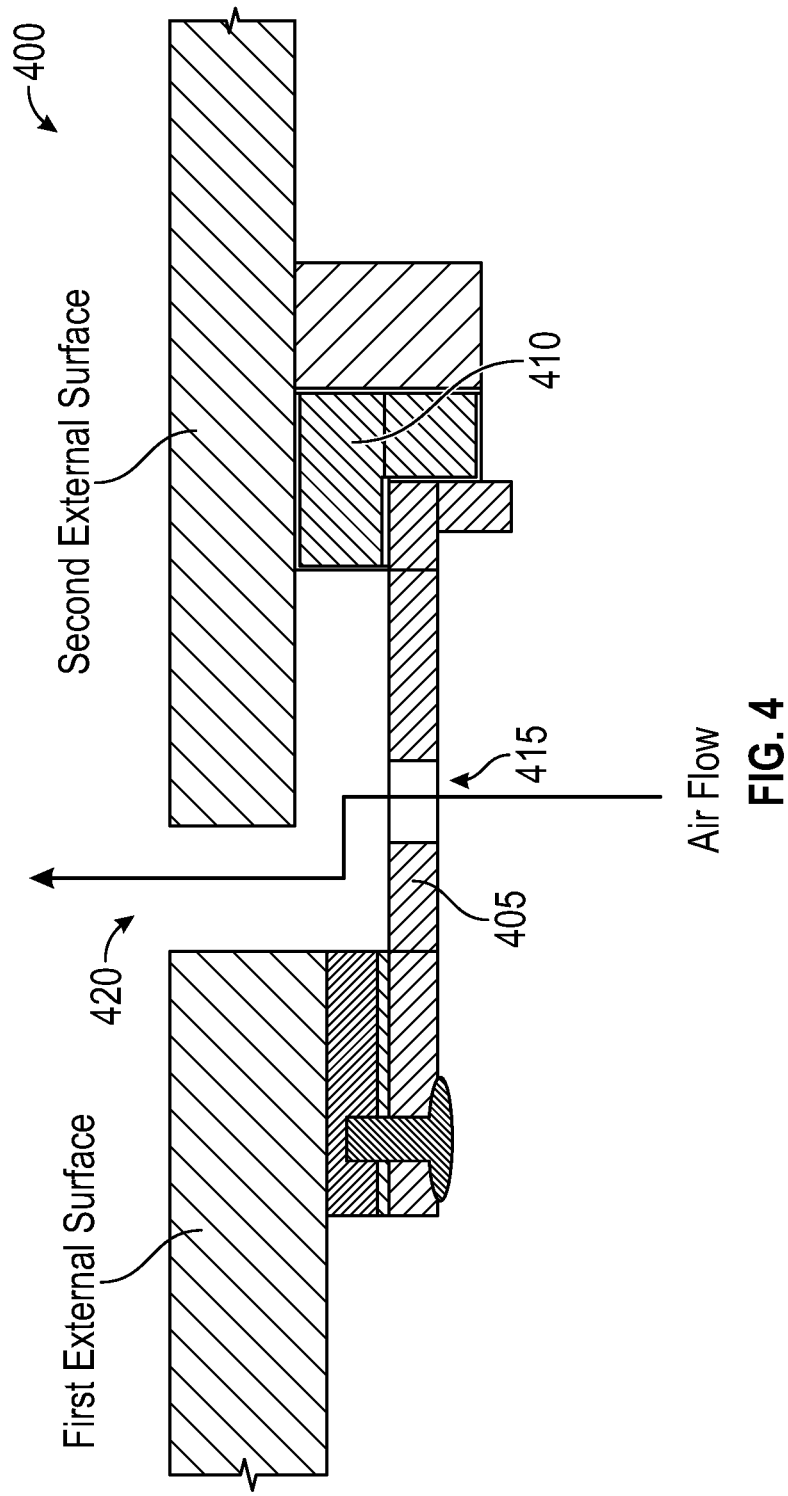
FIG. 4 shows a joint.

FIG. 4 shows a joint 400 that may be disposed between the first external surface and the second external surface. Joint 400 may be electrically conductive and thermally resistive. Joint 400 may comprise a flange 405 and a gasket 410. Gasket 410 may comprise an Electromagnetic Interference (EMI) gasket that may comprise fabric over foam gasketing for EMI grounding. As shown in FIG. 4, flange 405 may extend from the first external surface and compresses gasket 410 that may be attached to the second external surface. Flange 405 may comprise a plurality of perforations (e.g., illustrated by perforation 415). The plurality of perforations may be offset from an air gap 420 between the first external surface and the second external surface.

As described above, first joint 130, second joint 135, and third joint 140 may collectively comprise joint 400 between the first external surface and the second external surface that may be electrically conductive and thermally resistive. FIG. 4 shows a cross-section view of joint 400 that may provide EMI shielding with minimal heat conduction across joint 400 and may allow some airflow in and out of system 100 via the plurality of perforations. The offset between the plurality of perforations and air gap 420 may prevent stray material from entering and damaging the electronic components in system 100.

Flange 405 may comprise a 0.031" thick Cold Rolled (CR) steel, perforated with Underwriters Laboratories (UL) required hole spacing. Flange 405 may attached to a bottom face of first external surface via fasteners (e.g., rivets, screws, etc.). The perforations in flange 405 may provide some ventilation in and out of the housing along the joint while still providing EMI grounding between the first external surface and the first external surface.

Figure 5:
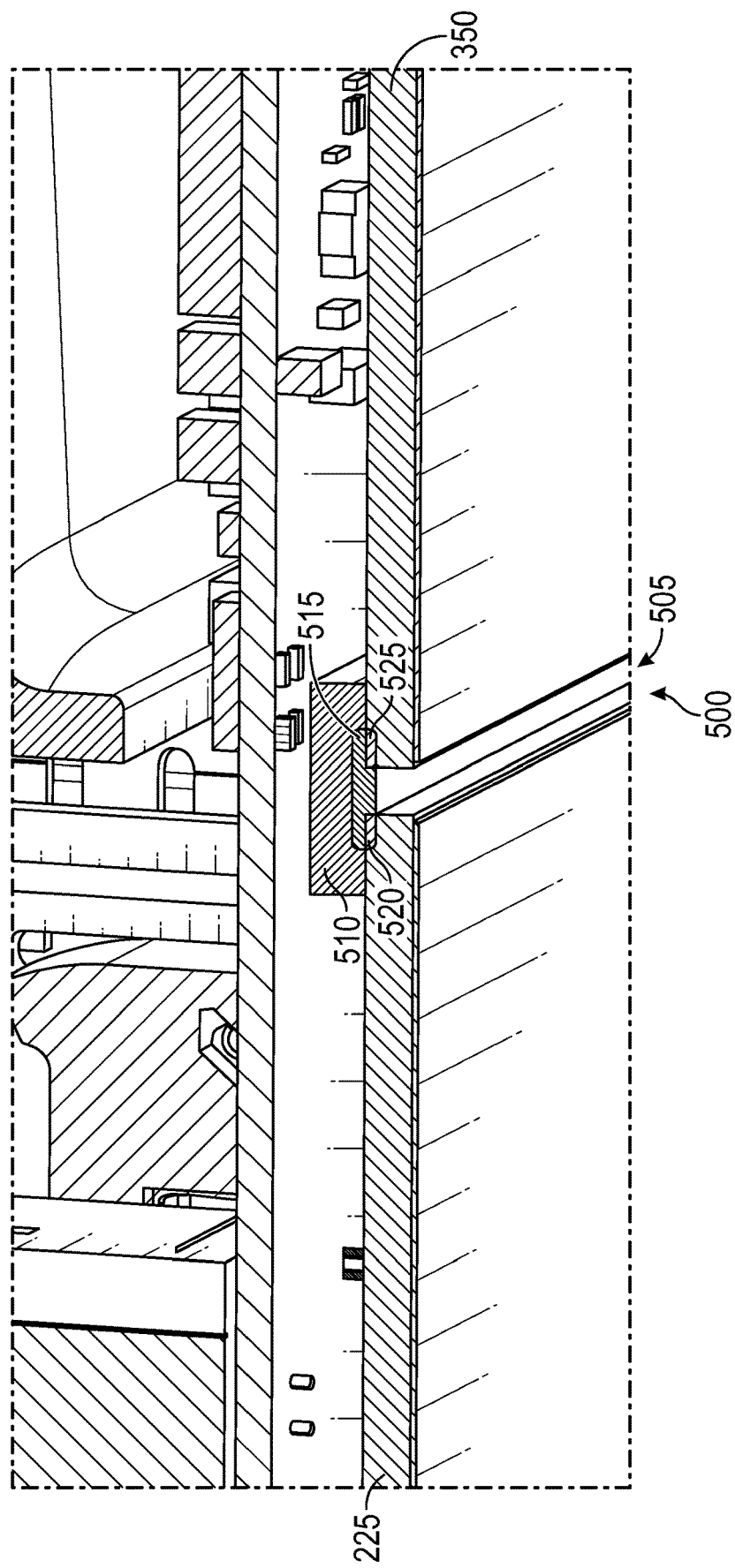
FIG. 5 shows a joint.

FIG. 5 illustrates a joint 500 that may be disposed under system 100 between bottom 225 and under panel 350. An air gap 505 may exist between bottom 225 and under panel 350. Joint 500, like joint 400, may be electrically conductive and thermally resistive. Joint 500 may comprise a first strip 510, a second strip 515, a first gasket 520, and a second gasket 525. First strip 510 may be non-conductive (e.g., plastic) and may mechanically attach and fasten bottom 225 and under panel 350 together. Because first strip 510 may be non-conductive, it may resist heat transfer between bottom 225 and under panel 350. First gasket 520 and second gasket 525 may comprise fabric over foam gasketing for Electromagnetic Interference (EMI) grounding and second strip 515 may be electrically conductive. As shown in FIG. 5, first gasket 520 and second gasket 525 may be compressed and the combination of first gasket 520, second gasket 525, and second strip 515 may provide EMI shielding with minimal heat conduction across joint 500 between bottom 225 and under panel 350.

Figure 6:
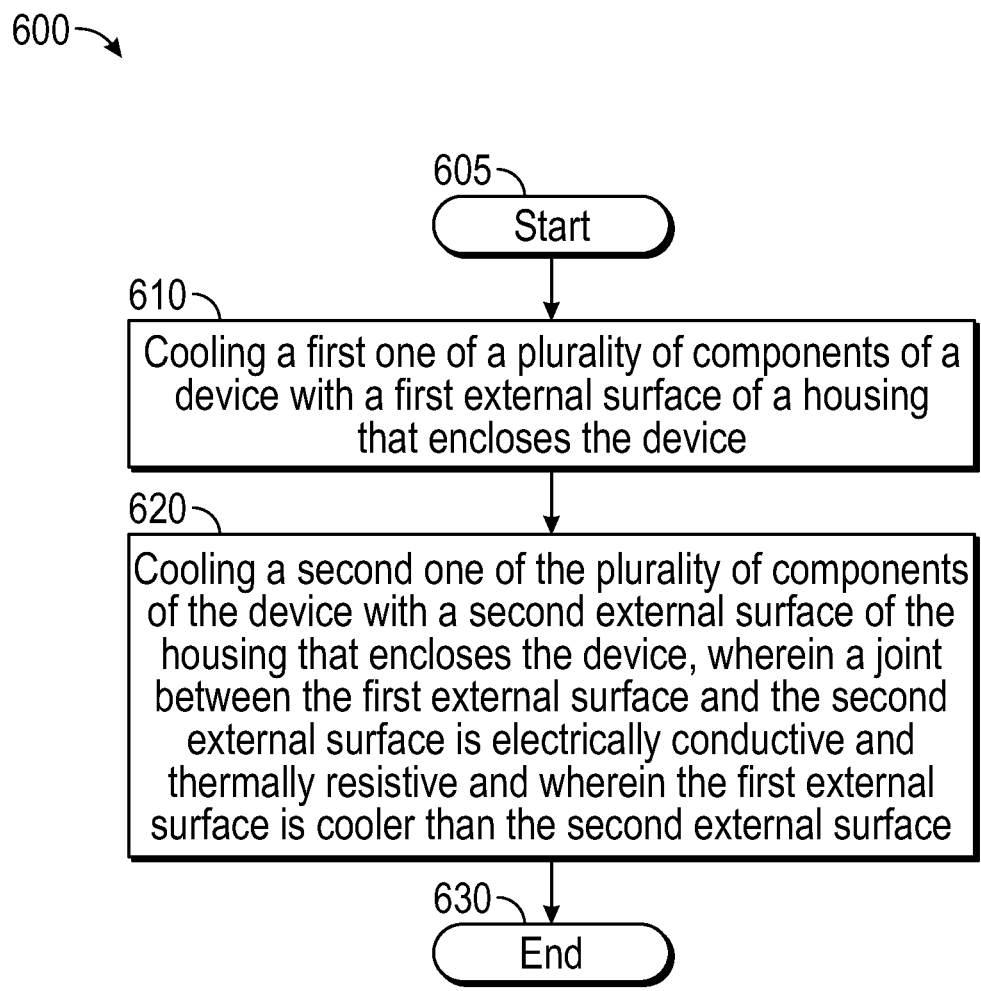
FIG. 6 is a flow chart setting forth the general stages involved in a method for providing cooling of components in a housing.

FIG. 6 is a flow chart setting forth the general stages involved in a method 600 consistent with an embodiment of the invention for providing a split enclosure for fan-less cooling. Method 600 may be implemented using system 100 as described in more detail below with respect to FIG. 1. Ways to implement the stages of method 600 will be described in greater detail below.

Method 600 may begin at starting block 605 and proceed to stage 610 where system 100 may cool the first one of a plurality of components of device 205 with the first external surface of housing 105 that encloses device 205. For example, front panel 110, first side 115, and second side 120 may comprise the first external surface dedicated to cooling the first one of a plurality of components comprising the device. The first one of the plurality of components may an optical module (e.g., first optical module 145 or second optical module 150). The optical module may comprise, but is not limited to, a Small Form-Factor Pluggable (SFP) module.

From stage 610, where system 100 cools the first one of a plurality of components of device 205 with the first external surface of housing 105 that encloses device 205, method 600 may advance to stage 620 where system 100 may cool the second one of the plurality of components of device 205 with the second external surface of housing 105 that encloses device 205. Joint 400 between the first external surface and the second external surface may be electrically conductive and thermally resistive and the first external surface may be cooler than the second external surface. For example, top 125 may comprise the second external surface dedicated to cooling the second one of the plurality of components. First joint 130, second joint 135, and third joint 140 may collectively comprise the joint (e.g., joint 400) between the first external surface and the second external surface that is electrically conductive and thermally resistive as described in greater detail above. The second one of the plurality of components may comprise, but is not limited to, an ASIC, a PHY component, or a memory. Once system 100 cools the second one of the plurality of components of device 205 with the second external surface of housing 105 that encloses device 205 in stage 620, method 600 may then end at stage 630.

Embodiments of the disclosure may provide a split enclosure apparatus for fan-less cooling. The apparatus may comprise a device comprising a plurality of components and a housing that encloses the device. The housing may comprise a first external surface dedicated to cooling a first one of the plurality of components, a second external surface dedicated to cooling a second one of the plurality of components, and a joint between the first external surface and the second external surface that is electrically conductive and thermally resistive. The first one of the plurality of components may comprise an optical module. The second one of the plurality of components may comprise an Application Specific Integrated Circuit (ASIC). The second one of the plurality of components may comprise a physical layer (PHY) component. The second one of the plurality of components may comprise a memory. The first external surface may be cooler than the second external surface. The first external surface may cool the first one of the plurality of components to 70 degrees C. or less. The second external surface may cool the second one of the plurality of components to 95 degrees C. or less. The device may comprise a network switch. The joint may comprise a flange and an Electromagnetic Interference (EMI) gasket. The flange may extend from the first external surface and compresses the EMI gasket that is attached to the second external surface. The flange may comprise a plurality of perforations. The plurality of perforations may be offset from an air gap between the first external surface and the second external surface. The first external surface may comprise a front panel and sides of the housing. The second external surface may comprise a top of the housing.

Embodiments of the disclosure may provide a split enclosure apparatus for fan-less cooling. The apparatus may comprise a device and a housing that encloses the device. The housing may comprise a first external surface, a second external surface, and a joint between the first external surface and the second external surface. The joint may be electrically conductive and thermally resistive. The joint may comprise a flange and an Electromagnetic Interference (EMI) gasket. The flange may extend from the first external surface and compresses the EMI gasket that may be attached to the second external surface. The flange may comprise a plurality of perforations. The plurality of perforations may be offset from an air gap between the first external surface and the second external surface.

Embodiments of the disclosure may comprise a method for providing a split enclosure for fan-less cooling. The method may comprise: cooling a first one of a plurality of components of a device with a first external surface of a housing that encloses the device; and cooling a second one of the plurality of components of the device with a second external surface of the housing that encloses the device, wherein a joint between the first external surface and the second external surface is electrically conductive and thermally resistive and wherein the first external surface is cooler than the second external surface. The first one of the plurality of components may comprise an optical module. The second one of the plurality of components may comprise one of an Application Specific Integrated Circuit (ASIC), a physical layer (PHY) component, and a memory. Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

The invention claimed is:

1. An apparatus comprising: a device comprising a plurality of components; and a housing that encloses the device, the housing comprising: a first external surface dedicated to cooling a first one of the plurality of components, a second external surface dedicated to cooling a second one of the plurality of components, and a joint between the first external surface and the second external surface, wherein the joint is electrically conductive and thermally resistive, wherein the joint comprises: a flange wherein the flange comprises a plurality of perforations and wherein the plurality of perforations are offset from an air gap between the first external surface and the second external surface; and a gasket.

2. The apparatus of claim 1, wherein the gasket comprises: an Electromagnetic Interference (EMI) gasket.

3. The apparatus of claim 2, wherein the flange extends from the first external surface and compresses the EMI gasket that is attached to the second external surface.

4. The apparatus of claim 1, wherein the first external surface comprises a front panel and sides of the housing.

5. The apparatus of claim 1, wherein the second external surface comprises a top of the housing.

6. The apparatus of claim 1, wherein the first external surface is cooler than the second external surface.

7. The apparatus of claim 1, wherein the first external surface cools the first one of the plurality of components to 70 degrees C. or less.

8. The apparatus of claim 1, wherein the second external surface cools the second one of the plurality of components to 95 degrees C. or less.

9. The apparatus of claim 1, wherein the first one of the plurality of components comprises an optical module.

10. The apparatus of claim 1, wherein the second one of the plurality of components comprises an Application Specific Integrated Circuit (ASIC).

11. The apparatus of claim 1, wherein the second one of the plurality of components comprises a physical layer (PHY) component.

12. The apparatus of claim 1, wherein the second one of the plurality of components comprises a memory.

13. The apparatus of claim 1, wherein the device comprises a network switch.

14. An apparatus comprising:
a device; and
a housing that encloses the device, the housing comprising:
a first external surface,
a second external surface, and
a joint between the first external surface and the second external surface wherein the joint is electrically conductive and thermally resistive and wherein the joint comprises:
a flange wherein the flange comprises a plurality of perforations and wherein the plurality of perforations are offset from an air gap between the first external surface and the second external surface, and
an Electromagnetic Interference (EMI) gasket.

15. The apparatus of claim 14, wherein the flange extends from the first external surface and compresses the EMI gasket that is attached to the second external surface.

16. A method comprising: cooling a first one of a plurality of components of a device with a first external surface of a housing that encloses the device; and cooling a second one of the plurality of components of the device with a second external surface of the housing that encloses the device, wherein a joint between the first external surface and the second external surface is electrically conductive and thermally resistive and wherein the first external surface is cooler than the second external surface, wherein the joint comprises a flange wherein the flange comprises a plurality of perforations wherein the plurality of perforations are offset from an air gap between the first external surface and the second external surface and wherein the joint further comprises an Electromagnetic Interference (EMI) gasket.

17. The method of claim 16, wherein the first one of the plurality of components comprises an optical module.

18. The method of claim 16, wherein the second one of the plurality of components comprises one of an Application Specific Integrated Circuit (ASIC), a physical layer (PHY) component, and a memory.

* * * * *